(12) United States Patent
Pan et al.

(10) Patent No.: US 8,692,368 B2
(45) Date of Patent: Apr. 8, 2014

(54) INTEGRATED VOLTAGE REGULATOR METHOD WITH EMBEDDED PASSIVE DEVICE(S)

(75) Inventors: Yuancheng Christopher Pan, San Diego, CA (US); Lew G. Chua-Eoan, San Diego, CA (US); Zhi Zhu, San Diego, CA (US); Junmou Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/367,932

(22) Filed: Feb. 7, 2012

(65) Prior Publication Data

US 2012/0293972 A1    Nov. 22, 2012

Related U.S. Application Data

(62) Division of application No. 12/552,321, filed on Sep. 2, 2009, now abandoned.

(51) Int. Cl.
*H01L 23/34*    (2006.01)

(52) U.S. Cl.
USPC ........... 257/724; 257/528; 257/531; 438/106; 438/381

(58) Field of Classification Search
USPC ................................. 257/531, 724; 438/381
See application file for complete search history.

(56) References Cited

U.S. PATENT DOCUMENTS

| | | | |
|---|---|---|---|
| 6,777,818 B2 | 8/2004 | Baldwin | |
| 6,809,421 B1 | 10/2004 | Hayasaka et al. | |
| 6,930,381 B1 * | 8/2005 | Cornelius | 257/692 |
| 7,378,733 B1 | 5/2008 | Hoang et al. | |
| 7,435,619 B2 | 10/2008 | Shim, II et al. | |
| 7,667,320 B2 | 2/2010 | Wood et al. | |

(Continued)

FOREIGN PATENT DOCUMENTS

| | | |
|---|---|---|
| EP | 1610599 A1 | 12/2005 |
| EP | 1761118 A1 | 3/2007 |

(Continued)

OTHER PUBLICATIONS

International Search Report and Written Opinion—PCT/US20101047538, International Search Authority—European Patent Office—Dec. 6, 2010.

(Continued)

*Primary Examiner* — Daniel Whalen
(74) *Attorney, Agent, or Firm* — Michelle S. Gallardo

(57) ABSTRACT

A stacked integrated circuit (IC) device includes a semiconductor IC having an active face, and an interconnect structure. The active face receives a regulated voltage from a voltage regulator (MEG). An active portion of the VREG, which supplies the regulated voltage to the semiconductor IC is coupled to the interconnect structure. A packaging substrate includes one or more inductors including a first set of through vias. The first set of through vias are coupled to the interconnect structure and cooperate with the active portion to provide the regulated voltage for the semiconductor IC. The IC also includes a printed circuit board (PCB) coupled to the packaging substrate. The PCB includes a second set of through vias coupled to the first set of through vias. The IC also includes one or more conducting paths on the PCB. The conducting path(s) couple together at least two through vias of the second set of through vias.

19 Claims, 11 Drawing Sheets

(56) References Cited

U.S. PATENT DOCUMENTS

| | | |
|---|---|---|
| 2006/0071649 A1 | 4/2006 | Schrom et al. |
| 2006/0071650 A1 | 4/2006 | Narendra et al. |
| 2007/0013080 A1 | 1/2007 | DiBene et al. |
| 2007/0045875 A1 | 3/2007 | Farnworth et al. |
| 2007/0114651 A1 | 5/2007 | Marimuthu et al. |
| 2007/0262132 A1 | 11/2007 | Burton et al. |
| 2008/0001698 A1 | 1/2008 | Hazucha et al. |
| 2008/0002380 A1* | 1/2008 | Hazucha et al. ............. 361/760 |
| 2008/0169896 A1 | 7/2008 | Edo et al. |
| 2009/0315167 A1 | 12/2009 | Sasaki et al. |
| 2009/0322414 A1* | 12/2009 | Oraw et al. .................. 327/537 |
| 2010/0148344 A1 | 6/2010 | Chandra et al. |
| 2011/0050334 A1 | 3/2011 | Pan et al. |
| 2011/0215863 A1 | 9/2011 | Pan et al. |
| 2011/0317387 A1* | 12/2011 | Pan et al. ..................... 361/782 |

FOREIGN PATENT DOCUMENTS

| | | |
|---|---|---|
| EP | 2018092 A | 1/2009 |
| JP | 2005183890 A | 7/2005 |
| KR | 19970009676 | 6/1997 |
| WO | WO2008003008 A2 | 1/2008 |

OTHER PUBLICATIONS

International Search Report and Written Opinion—PCT/US2011/042102, ISA/EPO—Sep. 8, 2011.

Pan et al., "Integrated Voltage Regulator with Embedded Passive Device(s) for a stacked IC", U.S. Appl. No. 12/825,937 filed Jun. 29, 2010, 41 of pages.

* cited by examiner

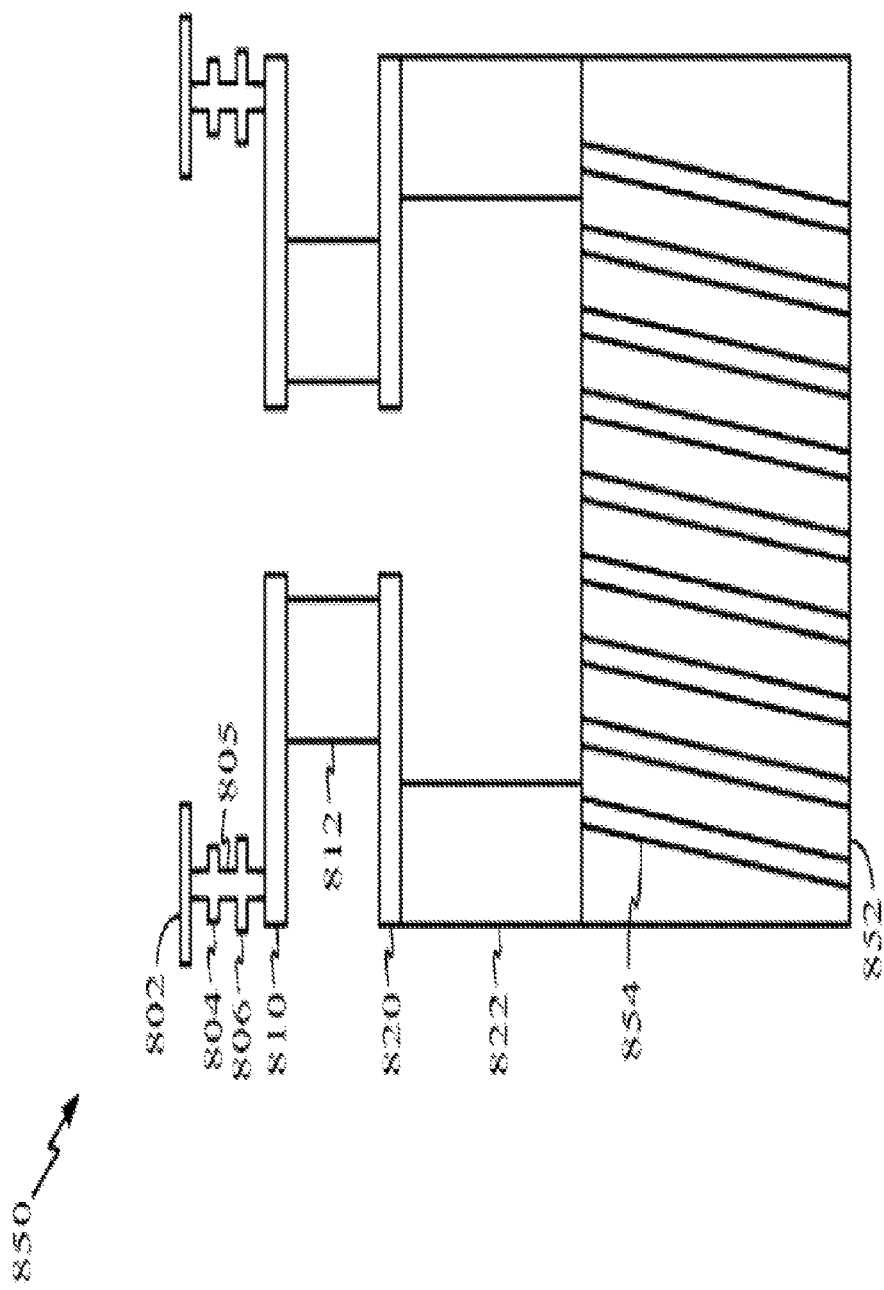

INTEGRATED VOLTAGE REGULATOR METHOD WITH EMBEDDED PASSIVE DEVICE(S)

CROSS REFERENCE TO RELATED APPLICATIONS

This application is a divisional of co-pending U.S. patent application Ser. No. 12/552,321 filed Sep. 2, 2009, entitled "INTEGRATED VOLTAGE REGULATOR WITH EMBEDDED PASSIVE DEVICE(S)."

This application is related, to co-pending U.S. patent application Ser. No. 13/108,335 entitled "INTEGRATED VOLTAGE REGULATOR WITH EMBEDDED PASSIVE DEVICE(S)," filed on May 16, 2011.

TECHNICAL FIELD

The present disclosure generally relates to integrated circuits (ICs). More specifically, the present disclosure relates to manufacturing integrated circuits.

BACKGROUND

Integrated circuits (ICs) are fabricated on wafers. Commonly, these wafers are semiconductor materials, such as silicon, and, singulated to form individual dies. Through efforts of research and development, the size of the transistors making up the ICs has decreased to 45 nm and will soon decrease to 32 nm. As transistor size decreases, the supply voltage to the transistors decreases. The supply voltage is conventionally smaller than wall voltages available in most countries or battery voltages used in portable devices. For example, an IC may operate at 1.25 Volts whereas the wall voltage is 120V or 240V. In a portable device, such as cellular phone, the battery voltage may range from 6V at full charge to 3V at near empty charge.

A semiconductor die may be coupled to a voltage regulator that converts available voltages at wall outlets or batteries to lower voltages used by the die. The voltage regulator ensures a constant voltage supply is provided to the die. This is an important function, because the ability of transistors to tolerate voltages under or over the target voltage is small. Only tenths of a volt lower may create erratic results in the die; only tenths of a volt higher may damage the die.

Dies are mounted on a packaging substrate, and the packaging substrate is mounted on a printed circuit board (PCB) approximately 1-2 mm thick during assembly. Conventionally, the voltage regulator is located on the PCB with the die to which the voltage regulator supplies voltage. Placing the voltaize regulator on the PCB separate from the die results in a voltage drop between the voltage regulator and the die that the voltage regulator supplies. For example, at a supply voltage of 1.125 Volts, a voltage drop of 0.100V may occur between the voltage regulator and the die as the voltage passes through the PCB, packaging substrate, and die. As the supply voltage decreases with shrinking transistor size, the voltage drop becomes a significant fraction of the supply voltage. Additionally, placing the voltage regulator on the PCB requires the use of pins on the die to allow the die to communicate with the voltage regulator. The die may send commands to the voltage regulator such as sleep or wake-up for scaling up or scaling down the voltage supply. The additional pins consume space on the die that could otherwise be eliminated.

Reducing the voltage drop from the voltage regulator to the die improves performance of the die. Maximum frequency of a die scales proportionally with supply voltage. For example, eliminating a voltage drop of 0.100V may increase a maximum frequency ($f_{max}$) of the die by 100 MHz. Alternatively, if the voltage drop is reduced and maximum frequency not increased, power consumption in the die is reduced. Power consumption is proportional to capacitance multiplied by a square of the supply voltage. Thus, reducing the supply voltage may result in significant power savings.

Further, conventional voltage regulators have slow response times due to the distance between the voltage regulator and the die. In the event the current transients are too fast for the voltage regulator to respond, decoupling capacitors provide additional power to the die. Voltage regulators located on the PCB often have response times in the microsecond range. Thus, large decoupling capacitors are placed on the packaging substrate to compensate for slow response times. The large decoupling capacitors occupy a large area. One conventional arrangement includes a bulk capacitor of microFarads and a multi-layer chip capacitor (MLCC) having hundreds of nanoFarads along with the voltage regulator on the PCB. The combination of the bulk capacitor and the MLCC supplies voltage to the die while the voltage regulator responds to the current transient.

Attempts have been made to place voltage regulators on the dies. However, voltage regulators include passive components such as inductors and capacitors that are also embedded in the dies. Passive devices consume die area, which increases manufacturing cost. For example, a die manufactured using 45 nm technology has a capacitance density of 10 femtoFarads/$\mu m^2$. At this density a suitable amount of capacitance may consume over 2.5 $mm^2$. Providing inductance to the voltage regulator conventionally uses an on-die inductor or a discrete inductor mounted on the packaging substrate. In addition to consuming large areas on a die, conventional on-die inductors have a low quality factor.

A quality factor for passive components embedded in a die is low because the passive components are manufactured thin to fit in the die. As the amount of conducting material shrinks, conductive or magnetic losses increase and degrade the quality factor. The quality factor is defined by the energy stored in a passive component versus energy dissipated in the passive component, for a passive component embedded in a die is low.

Thus, there is a need for a voltage regulator that is in close proximity to the die without consuming large amounts of die area.

BRIEF SUMMARY

According to one aspect of the disclosure, a voltage regulator has a passive portion at least partially embedded in a packaging substrate. The voltage regulator also has an active portion fabricated in a die coupled to the passive portion.

According to another aspect of the disclosure, a method of supplying voltage to a die mounted on a packaging substrate includes mounting an active portion of a voltage regulator on the packaging substrate. The method also includes coupling the active portion of the voltage regulator to at least one passive component at least partially embedded in the packaging substrate. The method further includes coupling the die to the at least one passive component.

According to yet another aspect of the disclosure, a method of supplying power to a die includes providing a supply voltage to an active portion of a voltage regulator mounted on a packaging substrate mounted on a printed circuit board. The method also includes passing the supply voltage from the active portion of the voltage regulator to at least one inductor at least partially embedded in the packaging substrate. The method further includes passing the supply voltage from the at least one inductor to at least one capacitor at least partially embedded in the packaging substrate. The method also includes passing the supply voltage from the at least one capacitor to the die.

According to a further aspect of the disclosure, a semiconductor packaging system includes a packaging substrate into which at least one means for storing energy is at least partially embedded. The semiconductor packaging system also includes means for regulating voltage mounted on the packaging substrate. The regulating voltage means cooperating with the energy storing means.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 8A-C are block diagram illustrating paths through a packaging substrate and printed circuit board that may provide inductance.

DETAILED DESCRIPTION

Figure 1:
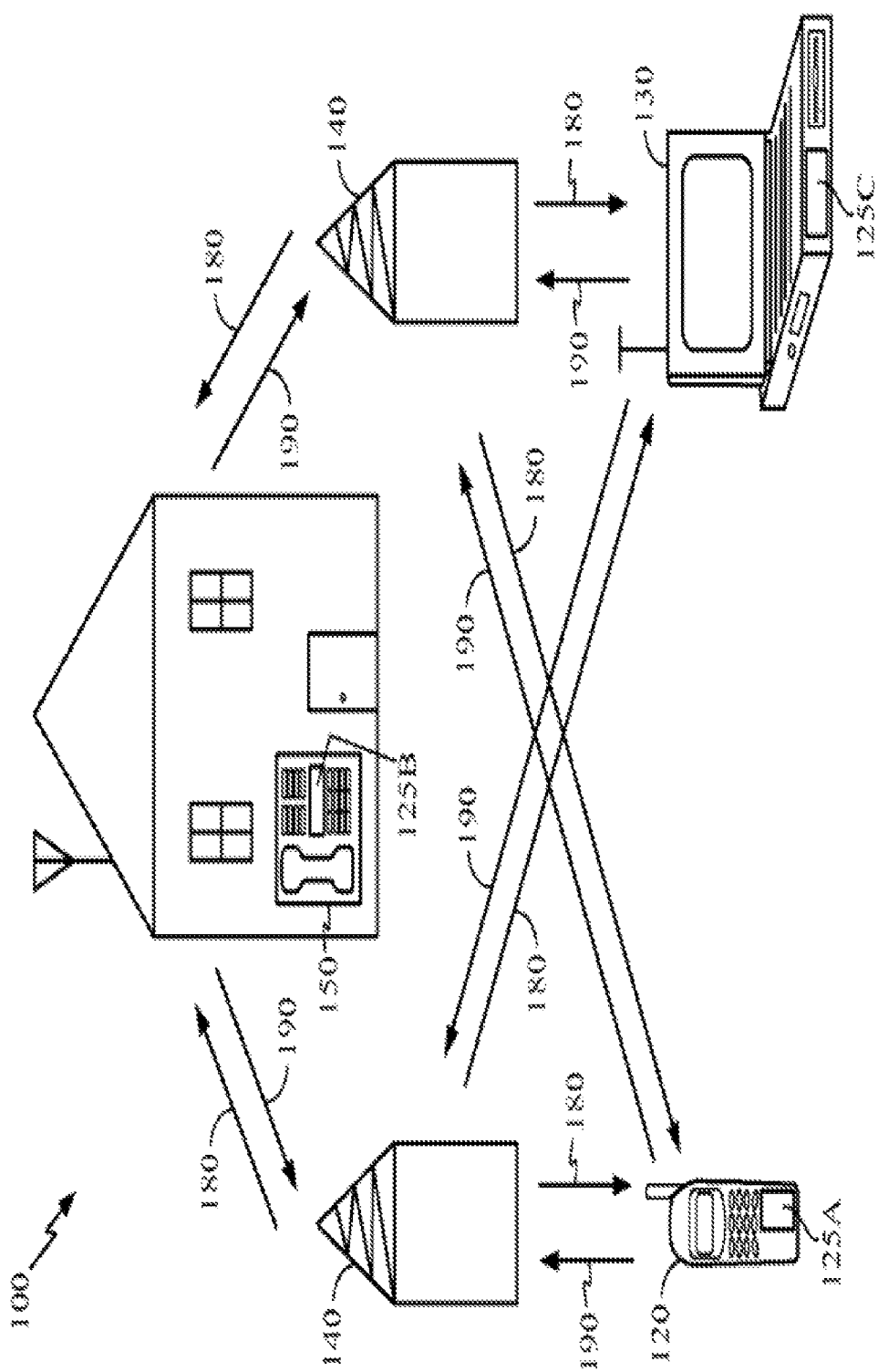
FIG. 1 is a block diagram showing an exemplary wireless communication system in which an embodiment of the disclosure may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that wireless communication systems may have many more remote units and base stations. Remote units 120, 130, and 150 include IC devices 125A, 125B and 125C, as disclosed below. It will be recognized that any device containing an IC may also include semiconductor components having the disclosed features and/or components manufactured by the processes disclosed here, including the base stations, switching devices, and network equipment. FIG. 1 shows forward link signals 180 from the base station 140 to the remote units 120, 130, and 150 and reverse link signals 190 from the remote units 120, 130, and 150 to base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units may be a device such as a music player, a video player, an entertainment unit, a navigation device, a communications device, a personal digital assistant (PDA), a fixed location data unit, and a computer. Although FIG. 1 illustrates remote units according to the teachings of the disclosure, the disclosure is not limited to these exemplary illustrated units. The disclosure may be suitably employed in any device which includes semiconductor components, as described below.

Figure 2:
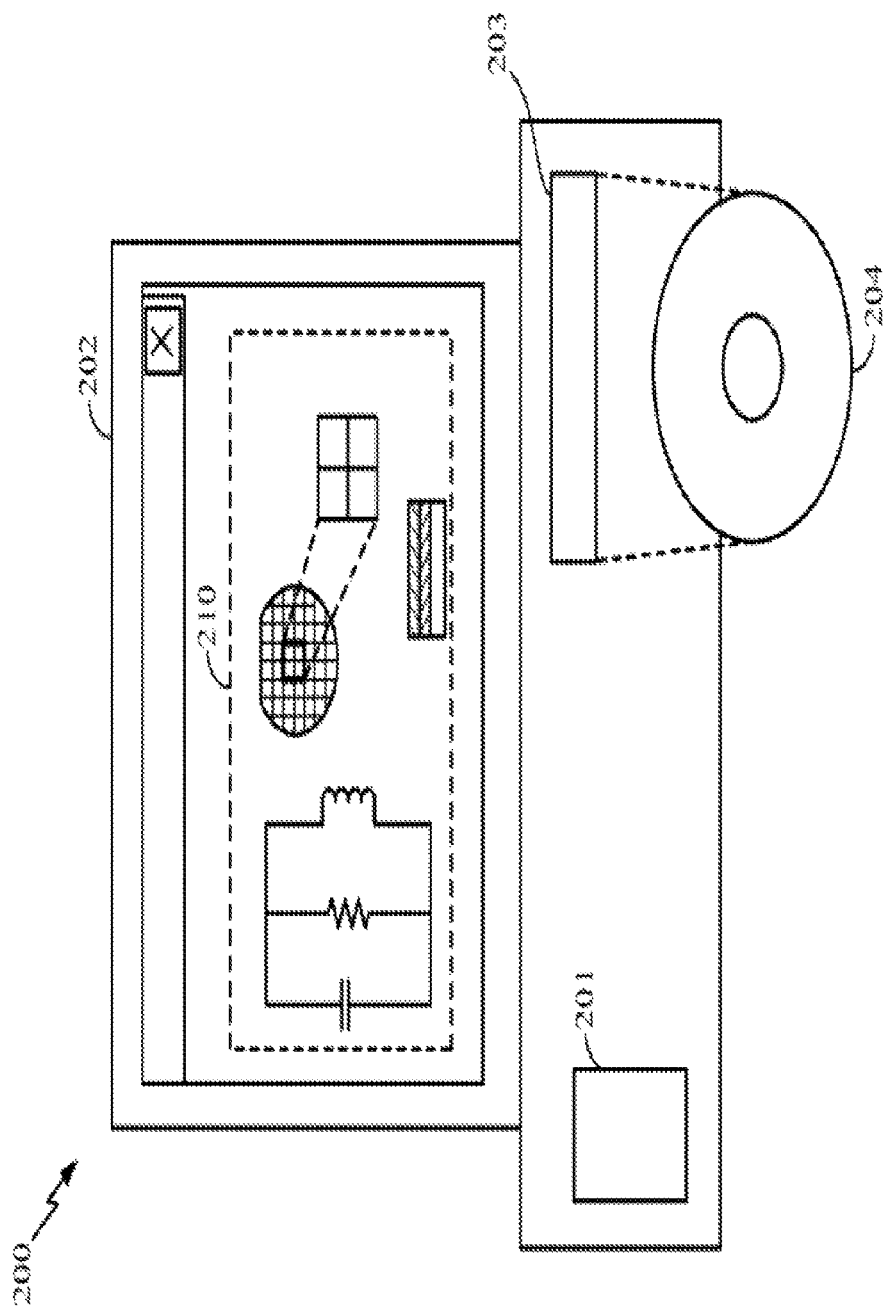
FIG. 2 is a block diagram illustrating a design workstation used for circuit, layout, and logic design of the disclosed semiconductor IC package.

FIG. 2 is a block diagram illustrating a design workstation for circuit, layout, and design of a semiconductor part as disclosed below. A design workstation 200 includes a hard disk 201 containing operating system software, support files, and design software such as Cadence or OrCAD. The design workstation 200 also includes a display to facilitate design of a semiconductor part 210 that may include a circuit and semiconductor dies. A storage medium 204 is provided for tangibly storing the semiconductor part 210. The semiconductor part 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. Providing data on the storage medium 204 facilitates the design of the semiconductor part 210 by decreasing the number of processes for designing circuits and semiconductor dies.

Figure 3:
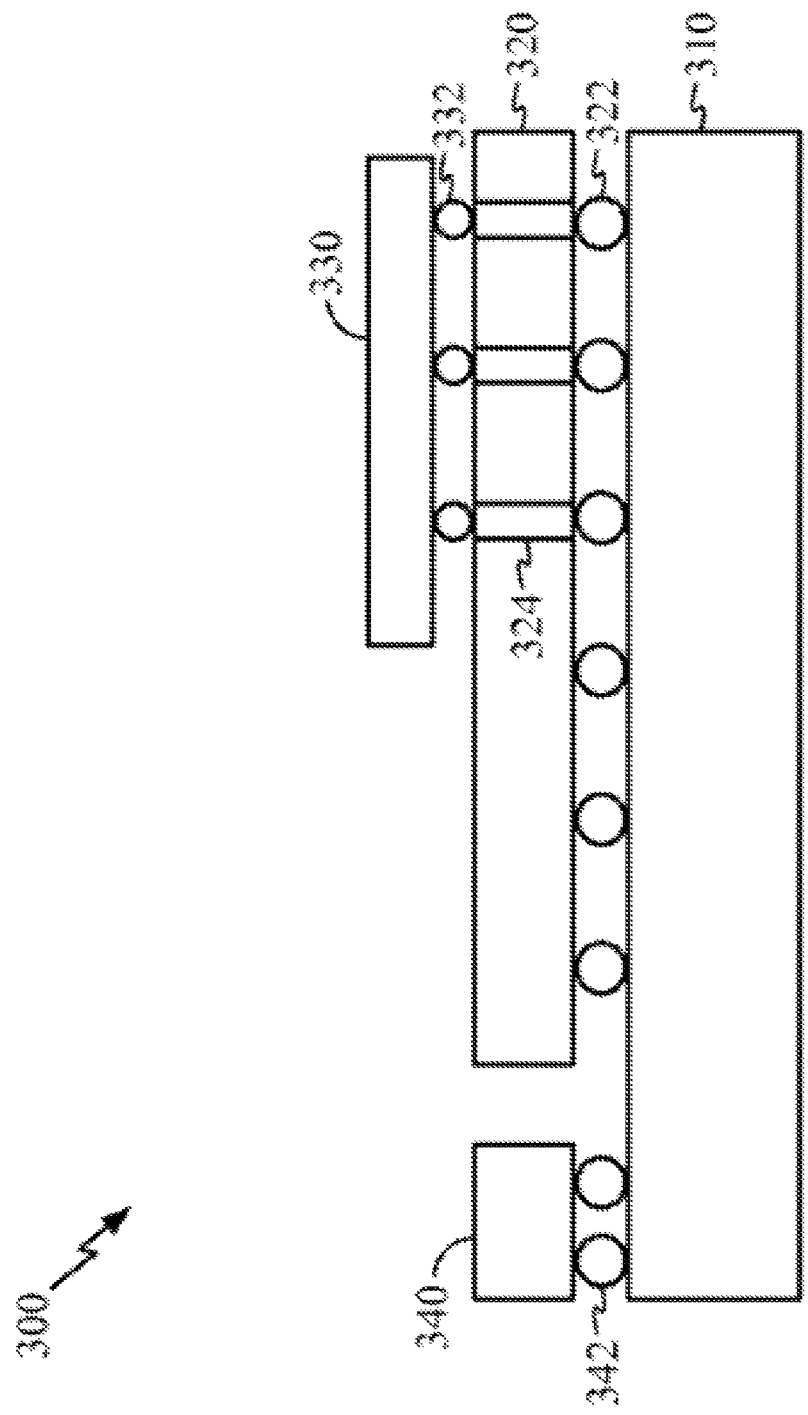
FIG. 3 is a cross-sectional view illustrating a conventional voltage regulator on a printed circuit board.

FIG. 3 is a cross-sectional view illustrating a conventional voltage regulator on a printed circuit board. An IC product 300 includes a printed circuit board (PCB) 310 that supports packaging substrates and provides communication between packaging substrates on the PCB 310. A packaging substrate 320 is coupled to the PCB 310 through a packaging connection 322 such as bumps or pillars and includes through vias 324 to enable communications between the PCB 310 and a die 330. The die 330 is coupled to the packaging substrate 320 through an interconnect structure 332 such as bumps or pillars.

A voltage regulator 340 is coupled to the PCB 310 through a packaging connection 342. The voltage regulator 340 conventionally couples to discrete passive components such as inductors and capacitors mounted on the PCB 310. Low inductance passes (not shown) provide power from the voltage regulator 340 to the die 330. The low inductance passes are restricted, in location on the PCB 310, which also restricts location of the voltage regulator 340. Thus, the distance between the voltage regulator 340 and the die 330 has a fixed minimum based on the PCB 310.

For the reasons discussed above including large voltage drop between the voltage regulator and the die, slow response times due to distance from the die to the voltage regulator, increased PCB size, the use of large decoupling capacitors, and the use of additional pins on the die to communicate with the voltage regulator, locating a voltage regulator on the PCB separate from the packaging substrate may not provide sufficient voltages to the die for proper operation. If the supply voltage drops below an acceptable level, the circuits on the die may output incorrect results or stop working completely.

According to one embodiment, a voltage regulator may be integrated into the die. An integrated voltage regulator in the die does not use additional pins for communicating with the die. Instead, communication occurs through interconnects in the die. The integrated voltage regulator is also closer to the die resulting in quicker response times to current transients and smaller decoupling capacitors to filter the output of the voltage regulator. Furthermore, passive components may be embedded in the packaging substrate to reduce area on the die occupied by the voltage regulator.

Passive components may be embedded in a packaging substrate or a PCB. Embedding the passive components maintains a short path having low inductance from the voltage regulator to the die. Further, the voltage regulator control loop bandwidth is increased by the higher switching frequency and shortened feedback path between the voltage regulator and the die.

Larger inductance values are achieved by embedding passive components in comparison to conventional parasitic air-core inductors in packaging substrate routing or PCB routing. Embedding passive components also reduces die size by reducing or eliminating discrete passive components of the voltage regulator, which may otherwise be located side-by-side with the die.

Figure 4:
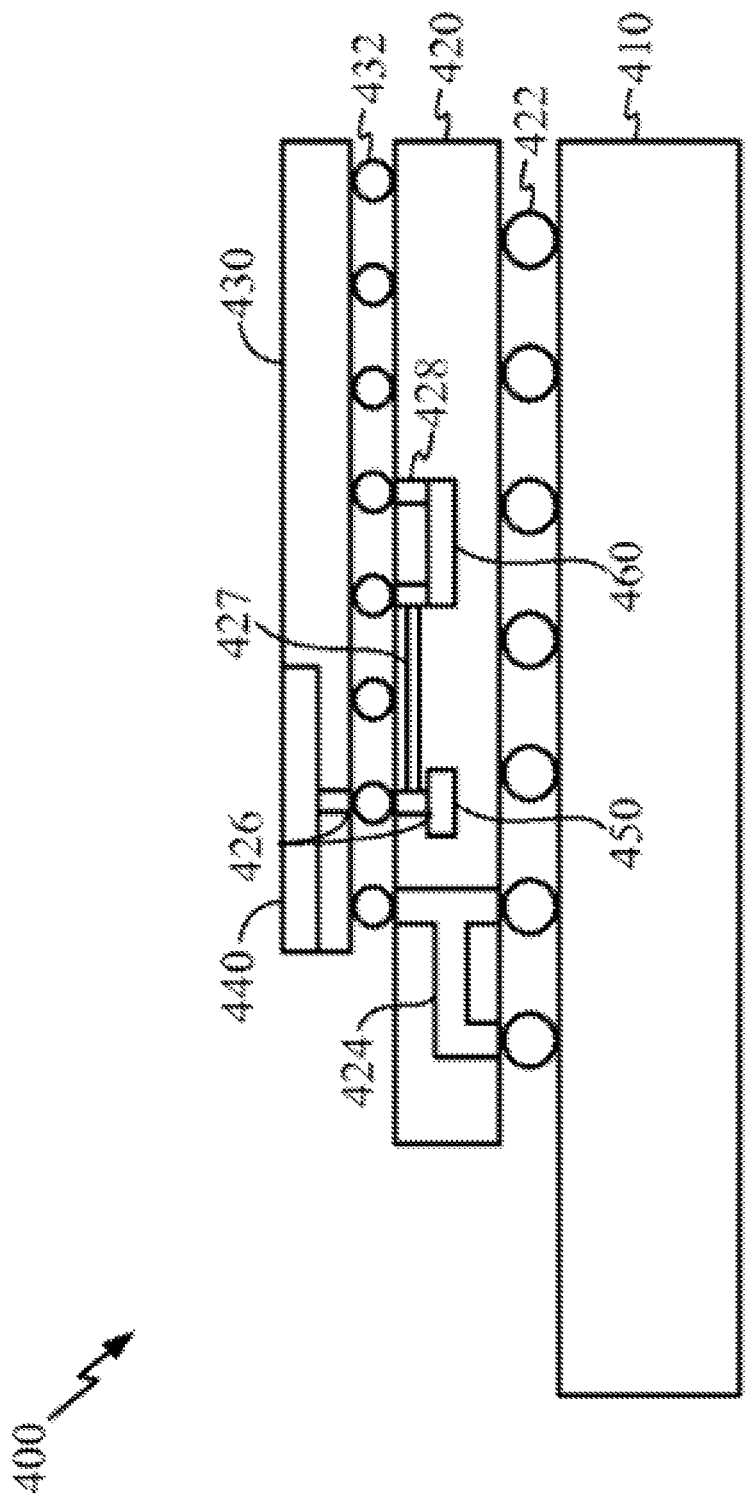
FIG. 4 is a block diagram illustrating an exemplary voltage regulator on a die according to a first embodiment.

FIG. 4 is a cross-sectional view illustrating an exemplary voltage regulator on a die according to a first embodiment. An IC product 400 includes a packaging substrate 420 coupled to a PCB 110 through a packaging connection 122 such as bumps or pillars. The packaging substrate 420 includes embedded passive components that may store energy in magnetic or electric form. For example, an embedded inductor 450 and an embedded capacitor 460 are at least partially embedded in the packaging substrate 420. The embedded, inductor 450 and/or the embedded capacitor 460 may use embedded die substrate (EDS) technology. In one embodiment, the embedded capacitor 460 may have capacitance values in the hundreds of nanoFarads and provide decoupling capacitance to a die 430. The die 130 is coupled to the packaging substrate 420 through an interconnect structure 432 such as bumps or pillars.

Manufacturing the embedded inductor 450 and the embedded capacitor 460 in the packaging substrate 420 may use a lamination process according to one embodiment. For example, the packaging substrate 420 may start as a core with two internal layers separated by a thick dielectric layer. Holes are placed in the substrate using a laser process and tape placed on a backside of the core. The holes are filled to form the embedded inductor 450 and the embedded capacitor 460, and a top side of the core is laminated. The embedded inductor 450 may be, for example, non air-core inductors to obtain higher inductance values than air-core inductors. Next, tape is peeled off the back side of the core, and the back side of the core is laminated. The inductance of the embedded inductor 450 and the capacitance of the embedded capacitor 460 are selected, in part, from parameters including a supply voltage of the die 430 and an operating frequency of the die 430. Passive components located in the packaging substrate 420 may use thicker copper than passive components located in a die and thus have smaller losses and a higher quality (Q) factor.

An active portion of a voltage regulator 440 is fabricated on the die 430 and includes, for example, a driver stage, a feedback stage, and/or a digital controller. The active portion of the voltage regulator 440 communicates with the embedded inductor 450 through an electrical path 426. An electrical path 427 couples the embedded inductor 450 to the embedded capacitor 460. An electrical path 428 couples the embedded capacitor 460 to the die 430. An electrical path 424 enables communication from the die 430 to the PCB 410. The electrical path 424 may be used, for example, to provide voltage to the active portion of the voltage regulator 440. That is, regulated voltage provided to the die 430 passes through the electrical path 424 to the active portion of the voltage regulator 440, then to the embedded inductor 450, and the embedded capacitor 460.

In one embodiment, the active portion of the voltage regulator 440 is integrated in the die 430. Thus, the active portion of the voltage regulator 440 responds quickly to current transients that occur in the die 430. According to one embodiment, the active portion of the voltage regulator 440 has a response frequency of approximately 200 MHz. Additionally, embedded passive components such as the embedded inductor 450 and the embedded capacitor 460 in the packaging substrate 420 reduce area on the die 430 that would otherwise be occupied by passive components. The voltage regulator 440 with embedded passive components as described above may, according to one embodiment, provide currents of several amps to the die 430.

Figure 5:
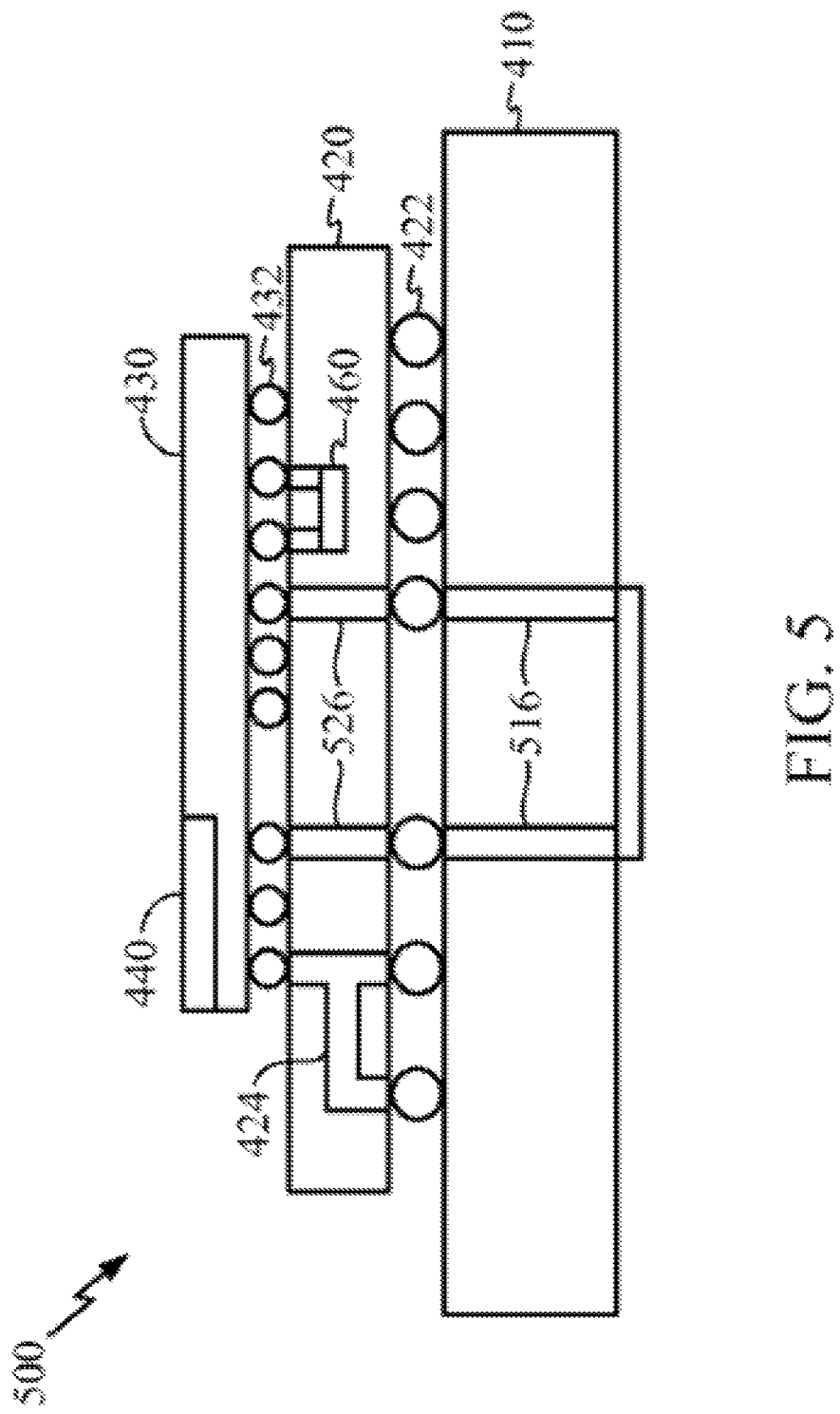
FIG. 5 is a cross-sectional view illustrating an exemplary voltage regulator on a die with an embedded parasitic inductance according to a second embodiment.

In an alternative configuration, some of the embedded passive components may be replaced with vias in the packaging substrates. FIG. 5 is a cross-sectional view illustrating an exemplary voltage regulator on a die with an embedded parasitic inductance according to a second embodiment.

The packaging substrate 420 includes vias 526 having a parasitic inductance used by the active portion of the voltage regulator 440 as inductors for supplying voltage to the die 430. The vias 526 may be through vias, which extend the entire height of the packaging substrate 420. The through vias 526 may be coupled through the packaging connection 422 to through vias 516 in the PCB 410 if a larger inductance is desired than obtained with the through vias 526 alone. The use of parasitic inductance in through vias within the packaging substrate as a passive component simplifies semiconductor manufacturing by reducing a number of processes to embed inductors in the packaging substrate.

Figure 6:
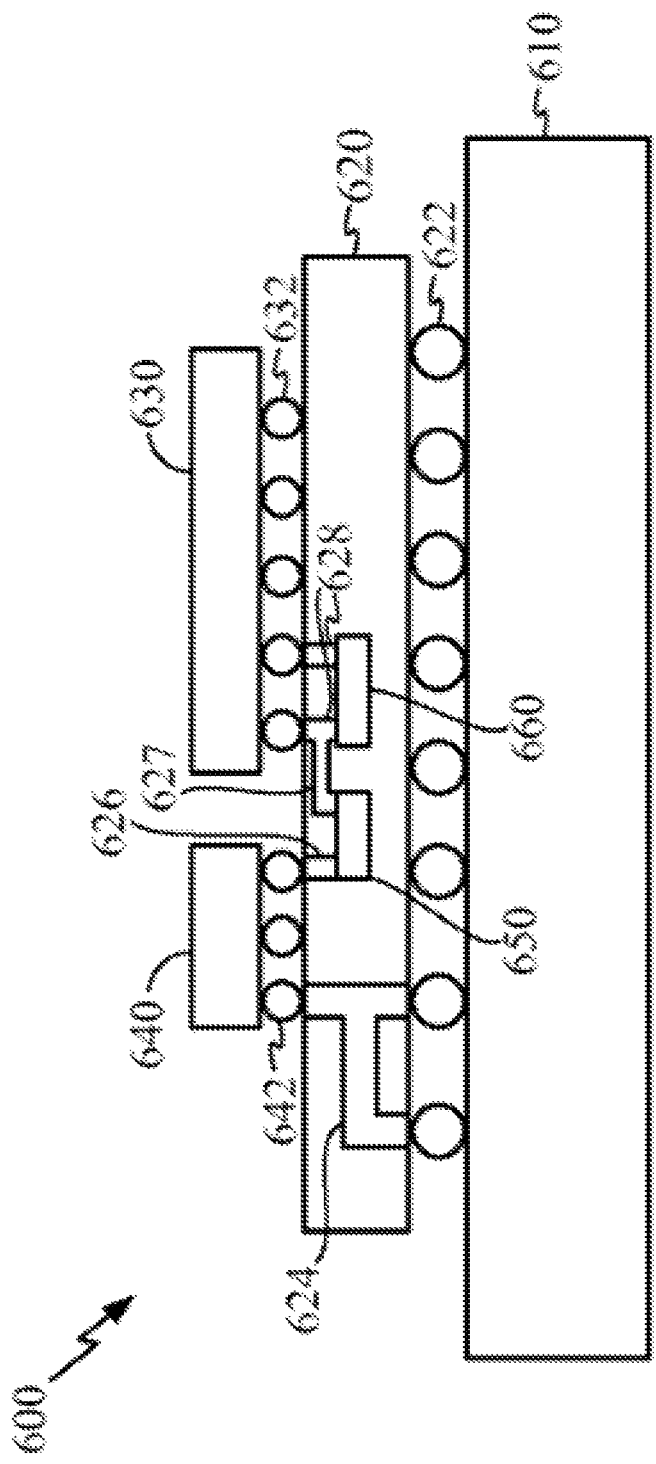
FIG. 6 is a cross-sectional view illustrating an exempla voltage regulator on a packaging substrate according to a third embodiment.

According to a third embodiment, an active portion of a voltage regulator may be separated from the die and mounted on the packaging substrate. FIG. 6 is a cross-sectional view illustrating an exemplary voltage regulator on a packaging substrate according to a third embodiment. An IC product 600 includes a packaging substrate 620 coupled to a PCB 610 through a packaging connection 622 such as bumps or pillars. A die 630 is coupled to the packaging substrate 620 through an interconnect structure 632 such as bumps or pillars. Additionally, an active portion of a voltage regulator 640 is coupled to the packaging substrate 620 through an interconnect structure 642 such as bumps or pillars. Inside the packaging substrate 620 is an embedded inductor 650 and an embedded capacitor 660.

The embedded capacitor 660 is coupled to the die 630 through an electrical path 628 and to the embedded inductor 650 through an electrical path 627. The embedded inductor 650 is coupled to the active portion of the voltage regulator 640 by an electrical path 626. Voltage is provided to the active portion of the voltage regulator 640 by an electrical path 624 from the PCB 610 through the packaging connection 622, the electrical path 624, and the interconnect structure 642.

The voltage regulator of FIG. 6 is an off-die voltage regulator coupled to the same packaging substrate as the die to which the voltage regulator supplies voltage. Locating the active portion of the voltage regulator on the packaging substrate but separate from the die allows different processes to be used for manufacturing the active portion of the voltage regulator and the die. For example, the die may be fabricated with 32 nm or 45 nm processes while the active portion of the voltage regulator may be fabricated with 0.18 μm processes. Additionally, the active portion of the voltage regulator may be manufactured at a different fabrication site than the die.

Figure 7A:
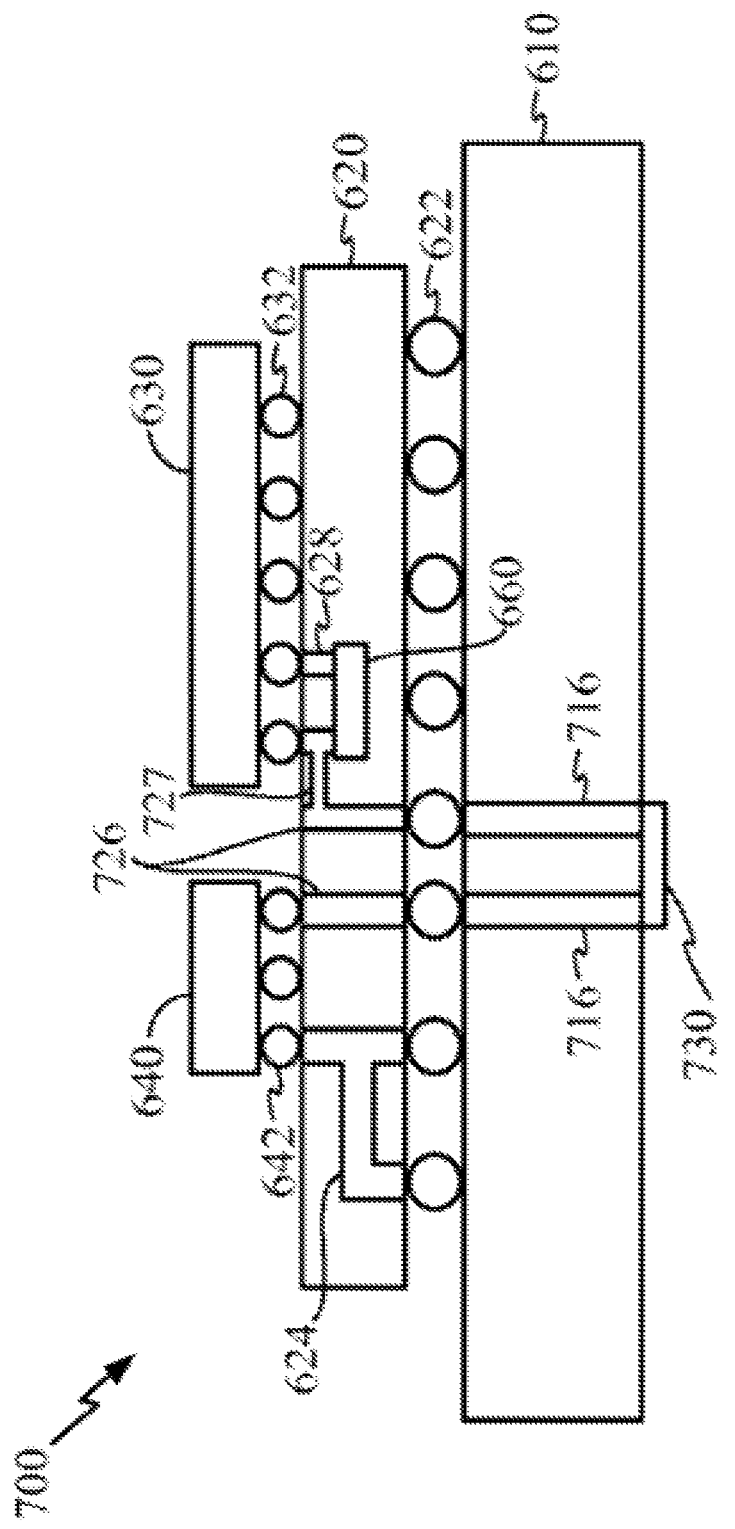
FIG. 7A is a cross-sectional view illustrating an exemplary voltage regulator on a packaging substrate with a parasitic inductance according to a fourth embodiment.

Turning now to a fourth embodiment, some of the embedded passive components may be replaced with vias in the packaging substrates. FIG. 7A is a cross-sectional view illustrating an exemplary voltage regulator on a packaging substrate with a parasitic inductance according to a fourth embodiment. An IC product 700 includes vias 726 in the packaging substrate 620 having a parasitic inductance that act as a filter for voltage provided from the active portion of the voltage regulator 640. Additional vias 716 in the PCB 610 may couple to the vias 726 through the packaging connection 622, if additional inductance is desired. The vias 716 are coupled through a conducting layer 730 on the PCB 610. The vias 716 or the vias 726 may be through vias, which extend the entire height of the PCB 610 or the packaging substrate 620, respectively.

Voltage is provided to the active portion of the voltage regulator 640, for example, through the electrical path 624. Regulated voltage is then output to the vias 726 and the vias 716. An electrical path 727 couples one of the vias 726 to the embedded capacitor 660, which is coupled to the die 630 through the electrical path 628.

Figure 7B:
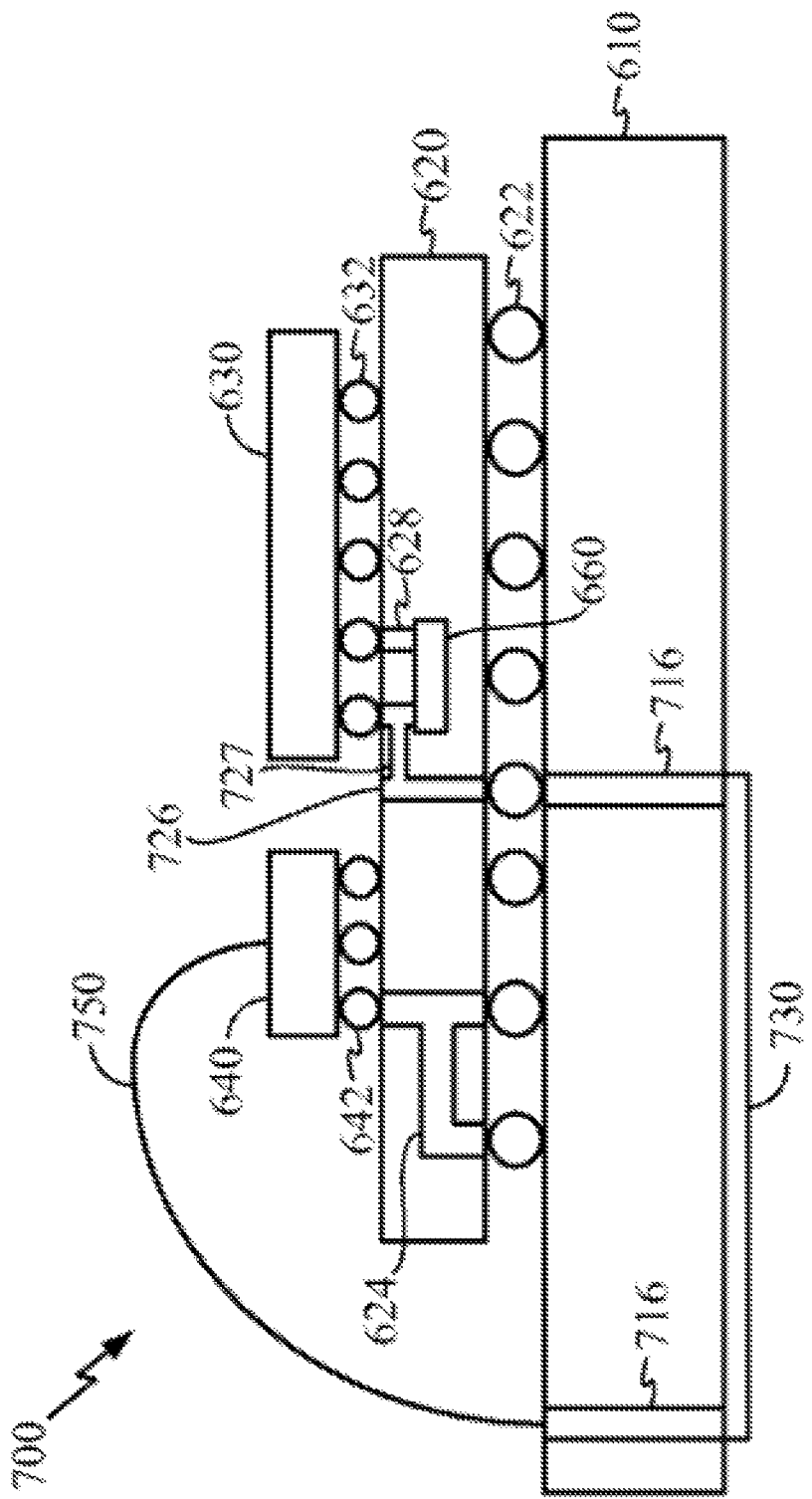
FIG. 7B is a cross-sectional view illustrating an exemplary voltage regulator with a wirebond inductance according to a fifth embodiment.

According to a fifth embodiment, inductance is provided by wirebonds. FIG. 7B is a cross-sectional view illustrating an exemplary voltage regulator with a wirebond inductance. A wirebond 750 couples the active portion of the voltage regulator 640 to one of the vias 716. The wirebond 750, the vias 716 and the conducting layer 730 provide inductance to the active portion of the voltage regulator 640.

Figure 8A:
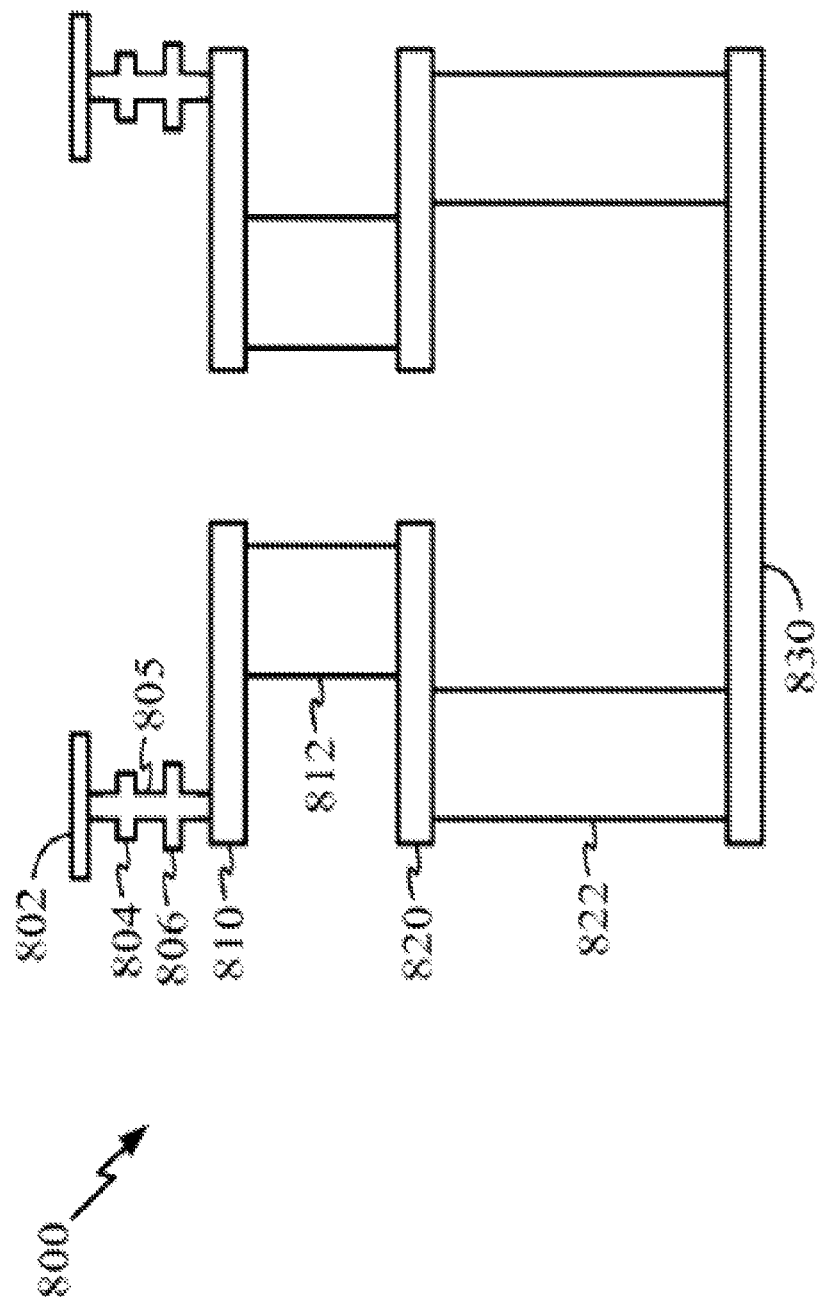
Figure 8B:
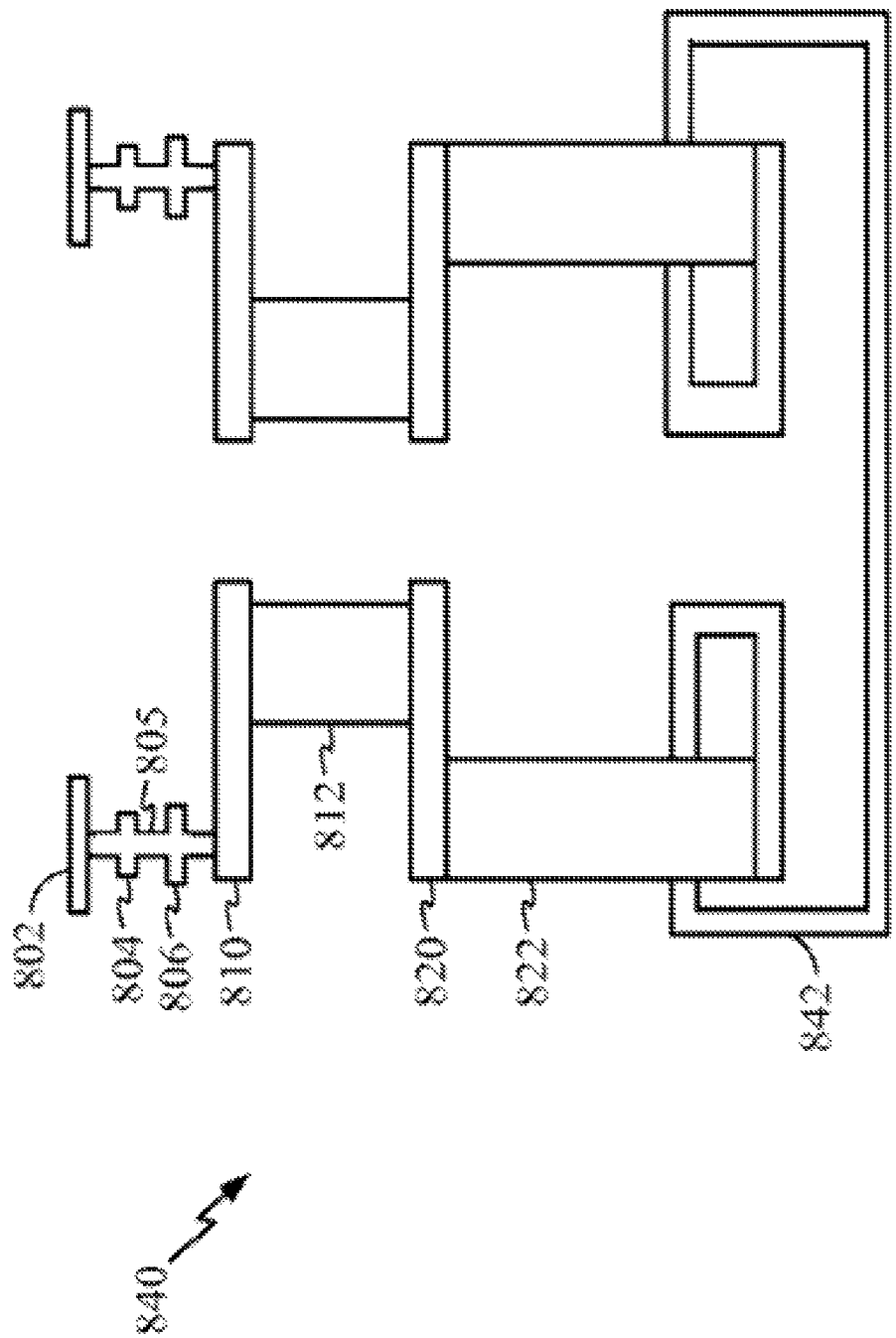

Embedded passives in which through vias provide inductance for a voltage regulator will now be described in further detail. FIGS. 8A-C are block diagrams illustrating paths through a packaging substrate and PCB that may provide inductance. FIG. 8A is a block diagram illustrating a path 800 through a packaging substrate and PCB according to one embodiment. A top conductive layer 802 and a bottom conductive layer 810 of a packaging substrate are shown. Inner layers 804, 806 of the packaging substrate are also shown. A through via 805, couples the top conductive layer 802 and the bottom conductive layer 810. A packaging connection 812 may be a bump of a ball grid array and couples the bottom conductive layer 810 to a top conductive layer 820 of a PCB. A through via 822 couples the top conductive layer 820 to a bottom conductive layer 830. The bottom conductive layer 830 may be an interconnect that couples to another through via in the PCB. The amount of inductance in the path 800 is proportional to a length of the path 800.

FIG. 8B is a block diagram illustrating a path 840 having a longer length than the path 800. A bottom conductive layer 842 couples the through via 822 to another through via in the PCB. The bottom conductive layer 842 includes extra length, for example in a coil, which increases the inductance of the path 840.

FIG. 8C is a block diagram illustrating a path 850 having a longer length than the path 840. An inductor coil 852 mounted on a back side of the PCB couples the through via 822 to another through via in the PCB. In this embodiment, a coiled wire 854 wraps around a block 852 to extend the length of the path 850.

A voltage regulator with passives embedded in packaging maintains a short and low inductive path from the voltage regulator to the die. Additionally, increased voltage regulator control loop bandwidth increases operating frequency and shortens a feedback path to the voltage regulator. Passive components embedded in the packaging substrate allow increased inductance and capacitance values. Further, the embedded passive components reduce packaging substrate top side area consumed by passive components.

Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit (IC) device, comprising:
a semiconductor IC having an active face and an interconnect structure, the active face receiving a regulated voltage from a voltage regulator including an active portion coupled to the interconnect structure and supplying the regulated voltage;
a packaging substrate, in which at least one inductor comprising a first plurality of through vias is embedded, the first plurality of through vias of the at least one inductor coupled to the interconnect structure and cooperating with the active portion of the voltage regulator to provide the regulated voltage for the semiconductor IC;
a printed circuit board coupled to the packaging substrate, the printed circuit board having a second plurality of through vias coupled to the first plurality of through vias of the at least one inductor; and
at least one conducting path on the printed circuit board, the at least one conducting path coupling together at least two through vias of the second plurality of through vias.

2. The integrated circuit device of claim 1, in which the active portion of the voltage regulator and the semiconductor IC are mounted on the packaging substrate.

3. The integrated circuit device of claim 1, further comprising a decoupling capacitor at least partially embedded in the packaging substrate and coupled to the active portion of the voltage regulator.

4. The integrated circuit device of claim 1, further comprising:
- a first packaging connection on the semiconductor IC coupled to the first interconnect structure and at least one of the first plurality of through vias of the at least one inductor; and
- a second packaging connection on the packaging substrate coupled to at least one of the first plurality of through vias.

5. The integrated circuit device of claim 4, in which the second packaging connection on the packaging substrate is coupled to at least one of the second plurality of through vias.

6. The integrated circuit device of claim 1, in which the at least one conducting path comprises a non-linear segment of wire.

7. The integrated circuit device of claim 1, in which the at least one conducting path comprises an inductor coil mounted on a back side of the printed circuit board.

8. The integrated circuit device of claim 1, further comprising a wire bond coupling the active portion of the voltage regulator to at least one of the second plurality of through vias.

9. The integrated circuit device of claim 8, in which the wire bond provides inductance to the active portion of the voltage regulator.

10. The integrated circuit device of claim 1, integrated into at least one of a music player, a video player, an entertainment unit, a navigation device, a communications device, a personal digital assistant (PDA), a fixed location data unit, and a computer.

11. An integrated circuit (IC) device, comprising:
- a semiconductor IC having an active face, and a means for interconnecting the semiconductor IC, the active face receiving a regulated voltage from a means for regulating a voltage;
- an active portion of the voltage regulating means coupled to the semiconductor IC interconnecting means for supplying the regulated voltage to the semiconductor IC;
- a packaging substrate, in which at least one inductor comprising a first plurality of through vias is embedded, the first plurality of through vias being coupled to the semiconductor IC interconnecting means and cooperating with the active portion of the voltage regulating means to provide the regulated voltage for the semiconductor IC;
- a printed circuit board coupled to the packaging substrate, the printed circuit board having a second plurality of through vias coupled to the first plurality of through vias; and
- means for coupling, on the printed circuit board, at least two of the second plurality of through vias.

12. The integrated circuit device of claim 11, further comprising a wire bond coupling the active portion of the voltage regulating means to at least one of the second plurality of through vias.

13. The integrated circuit device of claim 12, in which the wire bond provides inductance to the active portion of the voltage regulating means.

14. The integrated circuit device of claim 11, in which the coupling means comprises a non-linear segment of wire.

15. The integrated circuit device of claim 11, in which the coupling means comprises an inductor coil mounted on a back side of the printed circuit board.

16. The integrated circuit device of claim 11, integrated into at least one of a music player, a video player, an entertainment unit, a navigation device, a communications device, a personal digital assistant (PDA), a fixed location data unit, and a computer.

17. A method of supplying voltage to a die of an integrated circuit device, the method comprising:
- coupling an active portion of a voltage regulator to an interconnect structure of a semiconductor integrated circuit (IC);
- embedding at least one inductor comprising a first plurality of through vias in a packaging substrate;
- coupling the interconnect structure to the first plurality of through vias, the first plurality of through vias cooperating with the active portion of the voltage regulator to provide regulated voltage for the semiconductor IC;
- coupling a printed circuit board to the packaging substrate, the printed circuit board having a second plurality of through vias;
- coupling the second plurality of through vias to the first plurality of through vias; and
- coupling the second plurality of through vias together with a conducting path on the printed circuit board.

18. The method of claim 17, further comprising coupling a decoupling capacitor that is at least partially embedded in the packaging substrate to the active portion of the voltage regulator.

19. The method of claim 17, further comprising integrating the integrated circuit device into at least one of a music player, a video player, an entertainment unit, a navigation device, a communications device, a personal digital assistant (PDA), a fixed location data unit, and a computer.

* * * * *